(12) United States Patent
Perego et al.

(10) Patent No.: US 7,853,837 B2
(45) Date of Patent: Dec. 14, 2010

(54) MEMORY CONTROLLER AND METHOD FOR OPERATING A MEMORY CONTROLLER HAVING AN INTEGRATED BIT ERROR RATE CIRCUIT

(75) Inventors: Richard E. Perego, Thornton, CO (US); Christopher J. Madden, Los Altos, CA (US)

(73) Assignee: Rambus Inc., Los Altos, CA (US)

(*) Notice: Subject to any disclaimer, the term of this patent is extended or adjusted under 35 U.S.C. 154(b) by 369 days.

(21) Appl. No.: 11/677,843

(22) Filed: Feb. 22, 2007

(65) Prior Publication Data
US 2007/0136623 A1      Jun. 14, 2007

Related U.S. Application Data

(63) Continuation-in-part of application No. 10/939,028, filed on Sep. 10, 2004, now Pat. No. 7,246,274.

(51) Int. Cl.
*G06F 11/00* (2006.01)
*G11C 29/00* (2006.01)
*H04W 4/00* (2009.01)
*H04B 17/00* (2006.01)

(52) U.S. Cl. .................. 714/704; 714/718; 714/719; 714/733; 714/736; 365/200; 365/201; 370/333; 398/27

(58) Field of Classification Search .................. 714/704, 714/718, 719, 733, 736; 365/200, 201; 370/333; 398/27
See application file for complete search history.

(56) References Cited

U.S. PATENT DOCUMENTS

| | | | |
|---|---|---|---|
| 5,623,497 A | 4/1997 | Shimawaki et al. | |
| 6,298,315 B1 | 10/2001 | Li et al. | |
| 7,177,211 B2 * | 2/2007 | Zimmerman | 365/201 |
| 7,373,561 B2 * | 5/2008 | Baumer et al. | 714/704 |
| 7,519,886 B2 * | 4/2009 | Tsao et al. | 714/733 |
| 2008/0126664 A1 * | 5/2008 | Chan et al. | 710/316 |

OTHER PUBLICATIONS

Cai et al., Jitter Testing for Multi-Gigabit Backplae SerDes Techniques to Decompose and Combine Various Types of Jitter, 2002, IEEE ITC International Test Conference, p. 700-709.

(Continued)

*Primary Examiner*—John J Tabone, Jr.
(74) *Attorney, Agent, or Firm*—Vierra Magen Marcus & DeNiro LLP

(57) ABSTRACT

A system, among other embodiments, includes a memory controller having an integrated BER circuit and a plurality of memory devices. The memory controller also includes a control circuit and an interface having at least one transmit circuit to provide write data to at least one of the memory devices and at least one receive circuit to receive read data from at least one of the memory devices. The BER circuit includes a request generator circuit that outputs a request for a memory transaction. A request multiplexer selectively outputs a memory request to the interface from the request generator circuit or the control circuit. A data generator circuit outputs corresponding write data. A first write multiplexer selectively outputs the write data to the interface from the data generator circuit or the control circuit. A read multiplexer selectively receives read data from the receive circuit. The data generator circuit also outputs corresponding write data to a comparator circuit via a second write multiplexer. The comparator circuit outputs an error signal in response to a comparison of the received read data and corresponding stored write data. A counter outputs a count value indicating the number of errors (or bit errors) in response to the error signal. A register interface accesses the count value in the counter and a register that output one or more select signals during a mode of operation. The register interface also allows for controlling the data generator and request generator circuits.

19 Claims, 13 Drawing Sheets

OTHER PUBLICATIONS

Li et al. A New Method for Jitter Decomposition Through it's Distribution Tail Fitting, 1999, IEEE, ITC International Test Conference, p. 788-794.

Robert K. Morrow, Jr., Accurate CDMA BER Calculations with Low Computational Complexity, Nov. 1998, IEEE Trans. on Comm., vol. 46, No. 11, p. 1413-1417.

Fibre Channel-Methodologies for Jitter Specification, Methodology for Jitter Specification Technical Report, REV 10, Jun. 9, 1999, pp. 1-96.

Madden, et al., "System-Level BER Test and Jitter Extraction of a 6.4Gbps Parallel Chip to Chip Bus on the First Generation CELL (TM) Processor," Rambus Inc., Los Altos, CA, EPEP 2005, 4 pages.

* cited by examiner

US 7,853,837 B2

MEMORY CONTROLLER AND METHOD FOR OPERATING A MEMORY CONTROLLER HAVING AN INTEGRATED BIT ERROR RATE CIRCUIT

RELATED APPLICATION

This application is a continuation-in-part of U.S. patent application Ser. No. 10/939,028 filed on Sep. 10, 2004.

FIELD OF THE INVENTION

The present invention relates to predicting errors between integrated circuits ("IC").

BACKGROUND OF THE RELATED ART

Testing ICs, and in particular the interface between ICs is typically performed by specialized test equipment. The use of specialized test equipment increases manufacturing cost, complexity and time.

A test often performed on ICs or an apparatus including multiple ICs by specialized test equipment includes obtaining a bit error rate ("BER") for an IC or an interface between ICs.

Thus, it is desirable to provide a method and/or apparatus for predicting or estimating a BER for an IC or an interface between ICs without using specialized test equipment.

BRIEF DESCRIPTION OF THE DRAWING

The present invention is illustrated by way of example, and not by way of limitation, in the figures of the accompanying drawing like reference numerals refer to similar elements.

DETAILED DESCRIPTION

Figure 1:
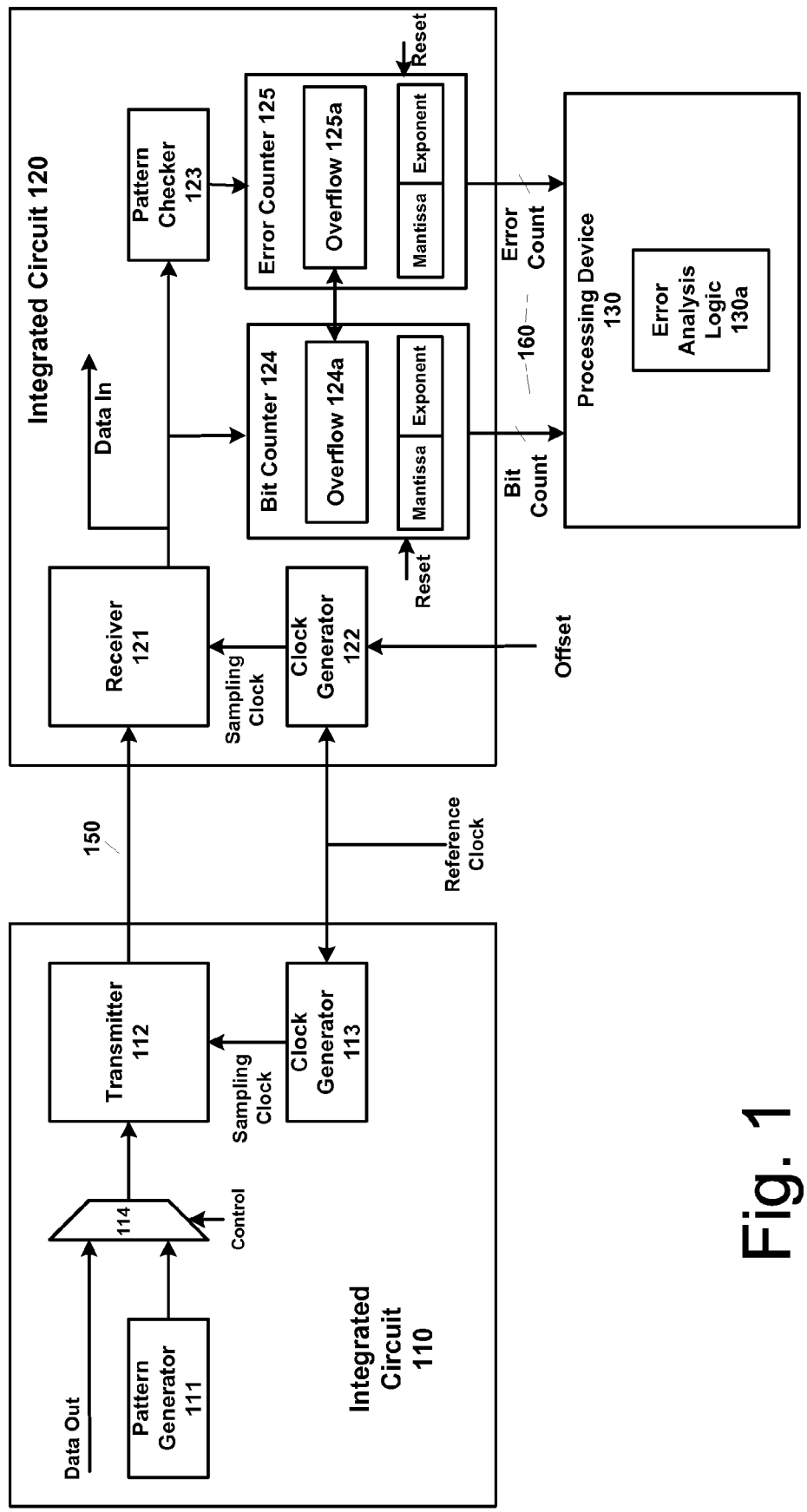
FIG. 1 illustrates an apparatus including offsetting a sampling clock signal in a receiver according to an embodiment of the present invention.

A system, among other embodiments, includes a memory controller having an integrated bit error rate ("BER") circuit and a plurality of memory devices. A BER circuit is included in a digital circuit or digital domain/logic layer as opposed to included in an interface circuit (or physical ("PHY") layer). The memory controller also includes a control circuit, also in the digital circuit. An interface circuit includes at least one transmit circuit to provide write data to at least one of the memory devices and at least one receive circuit to receive read data from at least one of the memory devices. The BER circuit includes a request generator circuit that outputs a request for a memory transaction. A request multiplexer selectively outputs a memory request to the interface from the request generator circuit or the control circuit. A data generator circuit outputs corresponding write data. A first write multiplexer selectively outputs the write data to the interface from the data generator circuit or the control circuit. A read multiplexer selectively receives read data from the receive circuit. The data generator circuit also outputs corresponding write data to a comparator circuit via a second write multiplexer. The comparator circuit outputs an error signal in response to a comparison of the received read data and corresponding stored write data. A counter outputs a count value indicating the number of errors (or bit errors) in response to the error signal. A register interface accesses the count value in the counter and a register that outputs one or more select signals during a mode of operation. The register interface also allows for controlling the data generator and request generator circuits.

In another embodiment, an integrated circuit memory controller includes an interface and digital circuit including a control circuit and BER circuit. The integrated circuit memory controller operates in a first and second mode of operation. During the first mode of operation, such as a typical memory access mode of operation, the control circuit outputs first control information and first write data to the interface while the control circuit receives read data from the interface. During a second mode of operation, such as a test or BER mode of operation, the BER control circuit outputs second control information and second write data to the interface. The BER control circuit receives second read data (corresponding to the transmitted write data) from the interface and compares the second read data with the stored second write data to determine an occurrence of a bit error. When the second write data and second read data do not match, an error may have occurred in transmitting the second write data, storing the second write data as the second read data and/or receiving the second read data.

In an embodiment, the BER control circuit includes a multiplexer to selectively input the second read data in response to a signal indicating the second mode of operation. A comparator outputs an error signal that indicates the occurrence of the bit error in response to a comparison of the second read data and second write data. A counter outputs a count value that represents the number of errors in response to the error signal. Another counter may store a count value that represents the number of bits received.

An integrated circuit memory controller interface may include a register interface to access bit and error count values by a processing device, such as a general-purpose computer or test computer. A digital value may be stored in the register (via the register interface) indicating the mode of operation and/or the assertion of one or more control/select signals to one or more circuit components in the integrated circuit memory controller during particular modes of operation. The processing device may also calculate a predicted BER value in response to accessing the bit and error count values.

In a method of operating an integrated circuit memory controller, a determination is made whether the integrated circuit memory controller enters a BER mode of operation. A memory command is then selected from a plurality of memory commands. The memory command is the output at an integrated circuit memory controller interface. Corresponding write data is also output at the interface. An input to receive read data corresponding to the write data is selected. The read data and write data are then compared. An error signal is then output in response to the comparison. A bit error count is incremented and stored. The bit error count value and is then output at the interface in order to calculate a predicted BER value. In an embodiment, the selecting an input to receive read data includes generating a select signal to a read multiplexer in response to a stored value in a register.

Many benefits may be obtained by integrating a BER circuit into a memory controller. First, as described in detail below, expensive specialized test equipment may be reduced or eliminated. Second, the quality of measured test signals may be improved. Specialized test equipment may have probes that introduce noise or affect a measured test signal. Third, input/output circuits that may be needed for specialized test equipment may be reduced or eliminated. The specialized input/output circuits may consume surface area and increase circuit manufacturing costs and complexity. In contrast, the use of a standard serial interface, rather than specialized input/output circuits, may reduce the complexity and time in manufacturing and testing. Fourth, test results may be obtained faster than using specialized test equipment with complicated test procedures. Fifth, integrating the BER circuit into the memory controller, as opposed to the memory controller interface, allows the efficient use of multiplexing interface resources, such as pins as well as transmit and receive circuits in the interface. Similarly, existing memory control circuits may be used in a BER circuit. Using a BER circuit in the memory controller allows for flexibility in the design and modification of test software that may be executed by the memory controller.

An apparatus and method provide an accurate prediction of the BER for data signals transferred between ICs without the use of specialized test equipment in embodiment of the present invention. DJ and RJ values, used for calculating a BER, are extracted by transferring a predetermined data pattern with a known adjustable timing offset of a sampling clock signal, counting the total number of bits transferred and errors in embodiments of the present invention. The total number of bits transferred and corresponding errors are then output to a processing device, such as a general purpose computer, that calculates a plurality of BERs corresponding to the plurality of offsets, transforms the plurality of BERs, forms a linear relationship between the transformed BERs and the plurality of offset and obtains the RJ and DJ values from the linear relationship in embodiments of the present invention. The RJ and DJ values then may be input into a Fibre Channel jitter model equation to accurately predict BER as a function of offset from a sampling clock signal.

Thus, embodiments of the present invention reduce testing and design cost and time. Further, In-situ system testing after final assembly, typical operational periodic calibration and remote fieldwork are performed with embodiments of the present invention.

Jitter is the slight movement of a signal in time or phase that can introduce errors and/or loss of synchronization in an embodiment of the present invention. Jitter includes the sum of two component values: a random jitter ("RJ") value and a deterministic jitter ("DJ") value in an embodiment of the present invention.

Random noise sources such as thermal noise provide a fundamental source of unavoidable errors and are usually accounted for in timing analysis as RJ. In an embodiment of the present invention, RJ has an unbounded Gaussian time distribution that is measured in terms of a probability such as a BER.

The other component of jitter is typically predictable and is usually accounted for in timing analysis as DJ.

Characterization of RJ and DJ jitter components is critical to predict the long-term BER of an apparatus. Typically, this is done with specialized testing equipment that is expensive in both time and resources to ensure every apparatus is tested accurately. A number of benefits can be achieved by eliminating the specialized test equipment. First, specialized input/output circuits in devices required for specialized test equipment are eliminated that will decrease the overall expense of the apparatus. Second, ICs may be periodically tested after manufacturing without the specialized test equipment. Third, as ICs become more complex, such as 4 pulse amplitude modulation ("4PAM") or wavelength division multiplexing ("WDM") ICs, a testing procedure that simplifies the testing of complex ICs will reduce time to market and improve development efficiency.

FIG. 1 illustrates an apparatus 100 including circuitry for offsetting a sampling clock signal in a receiver according to an embodiment described herein. In an embodiment, IC 110 is coupled to IC 120 by interconnect 150. IC 110 provides electrical signals on interconnect 150 to IC 120.

In an embodiment, interconnect 150, and interconnects described herein, include a signal path, plurality of or single trace, wire, conducting element, backplane link, combination thereof or an equivalent for conducing electrical and/or light signals. In embodiments, interconnects described herein, transfer data (read and/or write data), a memory request, such as a command (including read and/or write commands), clock information and/or control signals. In embodiments, interconnects are unidirectional (signals that travel in one direction) or bidirectional (signals that travel in two directions) or combinations thereof. In an embodiment, interconnects are point-to-point links and/or buses. Circuit components may likewise be connected in embodiments. In an embodiment, multiple interconnects may replace a single interconnect illustrated in the figures and a single interconnect may replace multiple interconnects illustrated in the figures.

Figure 3A:
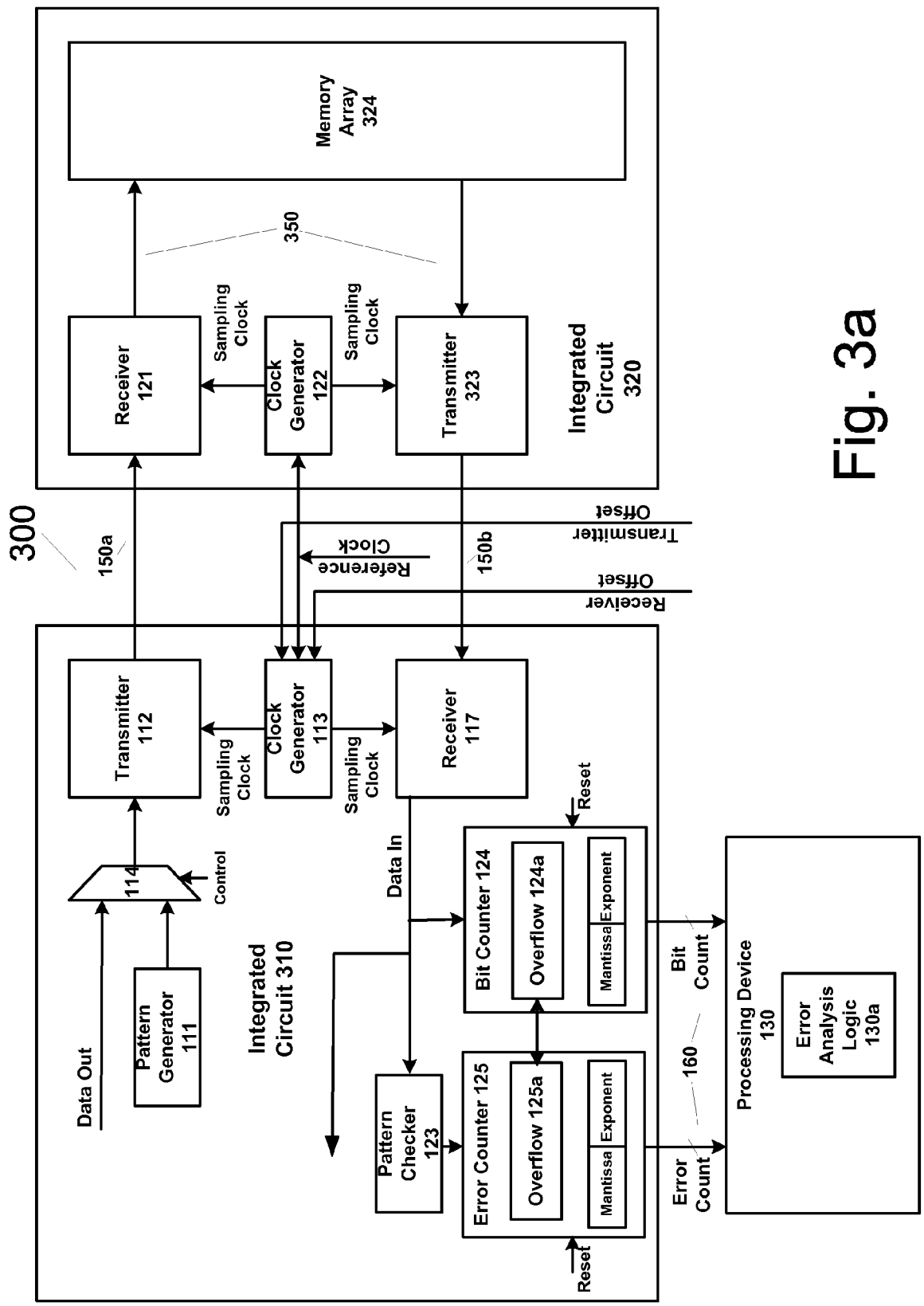
FIG. 3a illustrates an apparatus including a memory array according to an embodiment of the present invention.

In embodiments, ICs described herein, include a master device, such as a memory controller, graphics controller or processor, or slave devices, such as memory device having a memory array. In an embodiment, FIG. 3a illustrates an IC 310 that is a master device and IC 320 that is a memory device performing memory tasks. In another embodiment, IC 110 is a processor and IC 120 is a processor that simulates an interface of a memory device that is not yet available on the market. In still a further embodiment, ICs describe herein include limited features or functionality of a final manufactured monolithic IC discretely packaged device. ICs described herein are not specialized test ICs made from a different manufacturing process than a tested IC or have a generic interface to test multiple types of input/output ("I/O") interfaces of tested ICs.

ICs 110 and 120 are formed on a common substrate or die, such as a silicon wafer, or printed circuit board ("PCB") in embodiments. In alternate embodiments, ICs 110 and 120 are formed on different substrates or PCBs.

IC 110 includes pattern generator 111, multiplexer 114, transmitter 112 and clock generator 113. During a typical mode of operation, a data signal is input to multiplexer 114 that outputs the data signal to transmitter 112 responsive to a control signal input to multiplexer 114. Data is transmitted on interconnect 150 synchronously with respect to rising and falling edges of a sampling clock signal output from clock generator 113 in an embodiment. A reference clock signal is input to clock generators 113 and 122 in embodiments. In an embodiment, an external reference clock generator provides a reference clock signal. In an embodiment, a reference clock signal is generated from processing device 130.

Pattern generator 111 outputs a predetermined sequence of data values to multiplexer 114 during a test mode of operation. In an embodiment, pattern generator 111 generates a pseudo random bit sequence ("PRBS") that is also known by IC 120 (in particular pattern checker 123) that compares observed or received data values at receiver 121 to expected values in the PRBS known by pattern checker 123 to determine whether an error in a data bit occurred. In alternate embodiments, other pattern generators and/or checkers that are capable of detecting errors are used. The use of a pattern generator is preferred because a minimum amount of sampling components are used in receiver 121 and there is less likelihood of missing errors occurring at the center of a data eye as described below.

In an alternate embodiment, rather than using pattern generator 111, multiplexer 114 and pattern checker 123, an error is output from receiver 121 to error counter 125. In this embodiment, receiver 121 samples a data value at the approximate center of a data eye and an edge at an approximate edge of a data eye (also known as over-sampling) at the same approximate time and compares where an edge is located with respect to a data eye. In this embodiment, additional sampling components are used in receiver 121, but errors at the center of the data eye or "an ideal" center sample may not be observed.

IC 120 includes receiver 121, clock generator 122, pattern checker 123, bit counter 124 and error counter 125. A data signal is received at receiver 121 from interconnect 150 synchronously with respect to rising and/or falling edges of a sampling clock signal output from clock generator 122. An offset signal is provided to clock generator 122 to adjust or offset a sampling clock signal input to receiver 121 in an embodiment of the present invention. In an embodiment, an offset signal is generated from processing device 130. In an alternate embodiment, an offset signal is generated internal to IC 120 responsive to a control signal.

Figure 4:
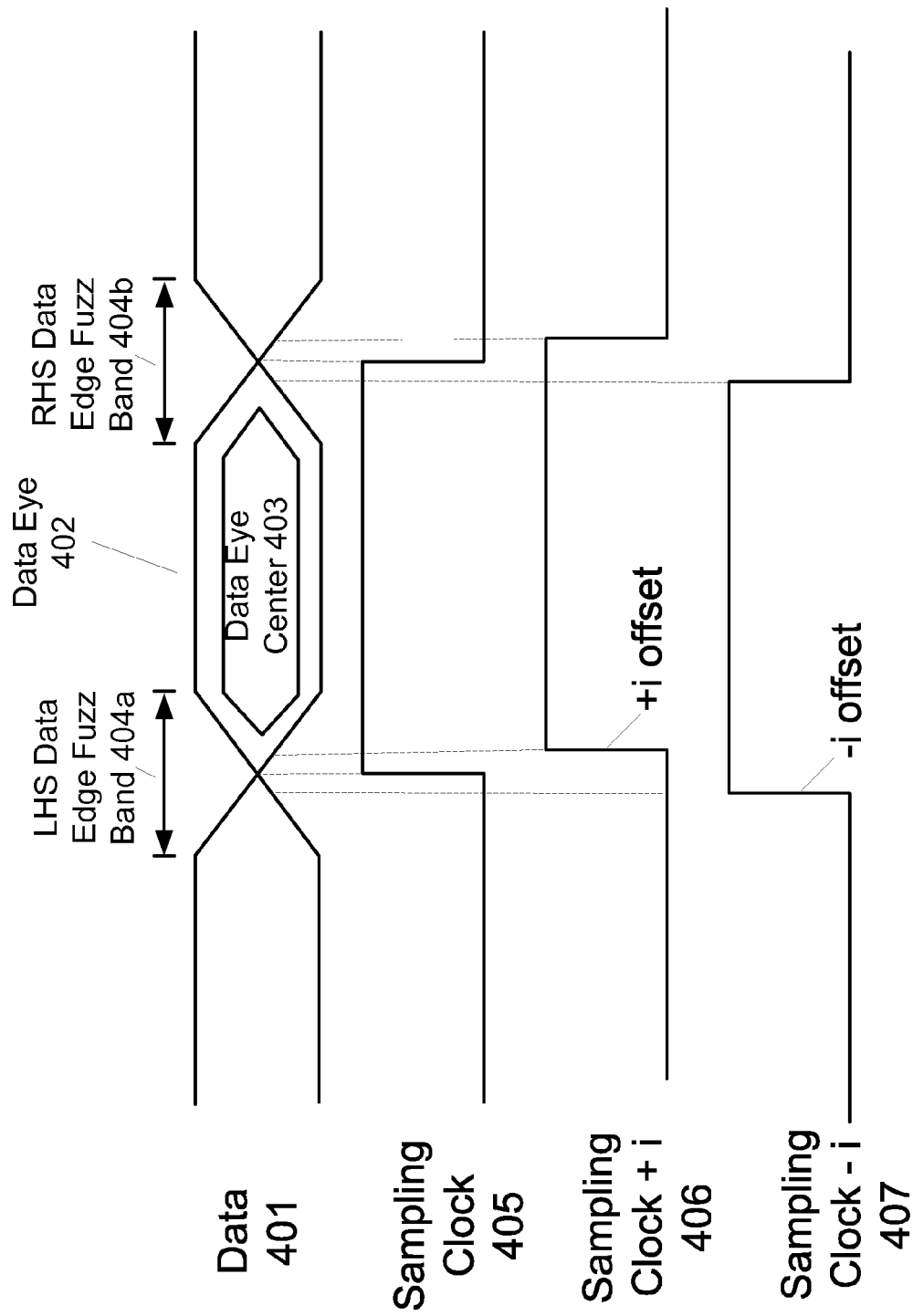
FIG. 4 illustrates adjusting or offsetting a sampling clock signal according to an embodiment of the present invention.

FIG. 4 illustrates adjusting a sampling clock signal by an offset signal (or receiver/transmitter offset signal) or increment/decrement (+i/−i) according to embodiments. An increment or decrement signal representing a phase or timing offset of a sampling signal is provided to a clock generator to provide a plurality of sampling clock signals associated with the respective offsets in embodiments. For example, FIG. 4 illustrates a sampling clock signal 405 having rising and falling edges approximately centered at LHS data edge fuzz band 404a and RHS data edge fuzz band 404b; while sampling clock signal 406 is incremented and sampling clock 407 is decremented with respect to sampling clock signal 405. In an embodiment, an increment/decrement or step size is 1/256 of one clock cycle or one clock cycle of a reference clock signal. In an embodiment of the present invention, an offset signal is an 8-bit digital word known as an offset word provided by processing device 130. Errors in the linearity of the offset step size are negligible in an embodiment.

A data signal 401, as shown in FIG. 4, includes a data eye 402 having a data eye center 403. A data eye 402 is a portion or time period of a data signal 401 where a data value associated with the data signal 401 is observed or sampled. A data value may be associated with a voltage or current value in embodiments. A data eye 402 has edges formed in LHS data edge fuzz band 404a and RHS data edge fuzz band 404b where a data signal may transition from one data value or logic state (i.e. logic 1) to another data value or logic state (i.e. logic 0).

Figure 5:
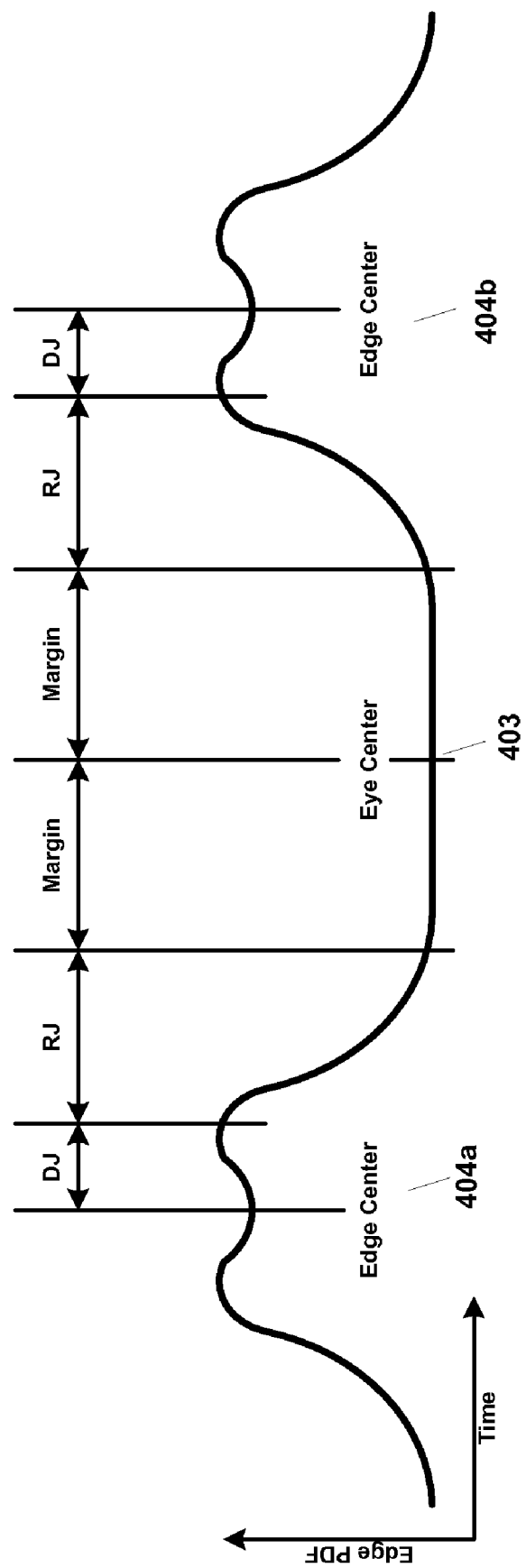
FIG. 5 illustrates a deterministic jitter ("DJ") component and a random jitter ("RJ") component according to an embodiment of the present invention.

FIG. 5 illustrates a DJ component and a RJ component corresponding to data signal 401 shown in FIG. 4 according to an embodiment. The edge probability density function ("PDF") is plotted versus time in FIG. 5. The "PDF" describes the probability of an edge occurring at a particular offset in an embodiment of the invention. As illustrated, errors in data eye center 403 are much less likely than near the edge centers of LHS data edge fuzz band 404a and RHS data edge fuzz band 404b which include DJ and RJ components.

A data signal from receiver 121 is output to pattern checker 123 and bit counter 124. Pattern checker 123 outputs an error signal responsive to a data signal from receiver 121 to error counter 125 in an embodiment. Pattern checker 123 compares an expected predetermined sequence of data values to received data values at receiver 121 and outputs an error signal to error counter 125 when a mismatch occurs.

IC 120 includes two counters: bit counter 124 and error counter 125 that keep track of a total number of data bits observed or measured and a corresponding total number of errors observed or measured during a period of time in an embodiment. Both counters handle a large dynamic range of data and error values, while reducing the number of bits used to keep track of and output totals stored in the counters.

Bit counter 124 counts the number of data bits received by receiver 121 and outputs the total number of data bits received during a period of time to interconnect 160 in an embodiment. Bit counter 124 includes overflow protection 124a for preventing overflow of the data count value of bit counter 124 in an embodiment. Overflow protection 124a stops the incrementing of bit counter 124 if either bit counter 124 or error counter 125 reaches its maximum. Once the maximum of either bit counter is reached, both counters are held until software can retrieve the information or count value in an embodiment. Thus, bit counter 124 and error counter 125 will hold accurate information for a particular set of received data.

Bit counter 124 is a logarithmic bit counter including a mantissa and exponent in an embodiment. A mantissa including an 8-bit word and an exponent including a 8-bit word is output as a 16-bit bus word on interconnect 160 responsive to a command by processing device 130 in an embodiment. For example, a 16-bit bus word could have the first 8 bits for the mantissa, and the later 8 bits for the exponent. The mantissa is calculated by simply displaying the 8 most significant bits ("MSB") after a 0 to 1 transition. The exponent is calculated by counting the number of least significant bits ("LSB") until the MSB 0 to 1 transition, thereby displaying a 256-bit ($2^8$) counter to 8 significant digits.

Bit counter 124 is reset to a predetermined value, such as zero, responsive to reset signal in an embodiment. A reset signal is generated internally to IC 120 responsive to a control signal or generated externally from processing device 130 in embodiments.

Error counter 125 counts the number of errors in the data received by receiver 121 and outputs a total number of errors to interconnect 160 in an embodiment.

Error counter 125 includes overflow protection 125a for preventing overflow of the error count value of error counter 125 in an embodiment. Error counter 125 includes overflow protection 125a that operates similar to overflow protection 124a, described above, in an embodiment.

Error counter 125 is a logarithmic bit counter including a mantissa and exponent in an embodiment. Error counter 125 is a logarithmic bit counter that operates similar to bit counter 124, described above, in an embodiment.

Bit counter 124 is reset to a predetermined value, such as zero, responsive to reset signal in an embodiment. A reset signal is generated internally to IC 120 responsive to a control signal or generated externally from processing device 130 in embodiments.

Processing device 130 is coupled to IC 120 by interconnect 160 in an embodiment. Processing device 130 is a general-purpose computer including computer readable memory in an embodiment. Error analysis logic 130a is software, or executable machine readable instructions, stored in non-volatile memory in processing device 130 in an embodiment. In an embodiment, error analysis logic 130a with processing device 130 performs some or all of the steps of methods 600, 700 and 1100, shown in FIGS. 6, 7a-b and 11 described below. In embodiments, the functionality of processing device 130 is included in one or more ICs described herein.

Figure 2:
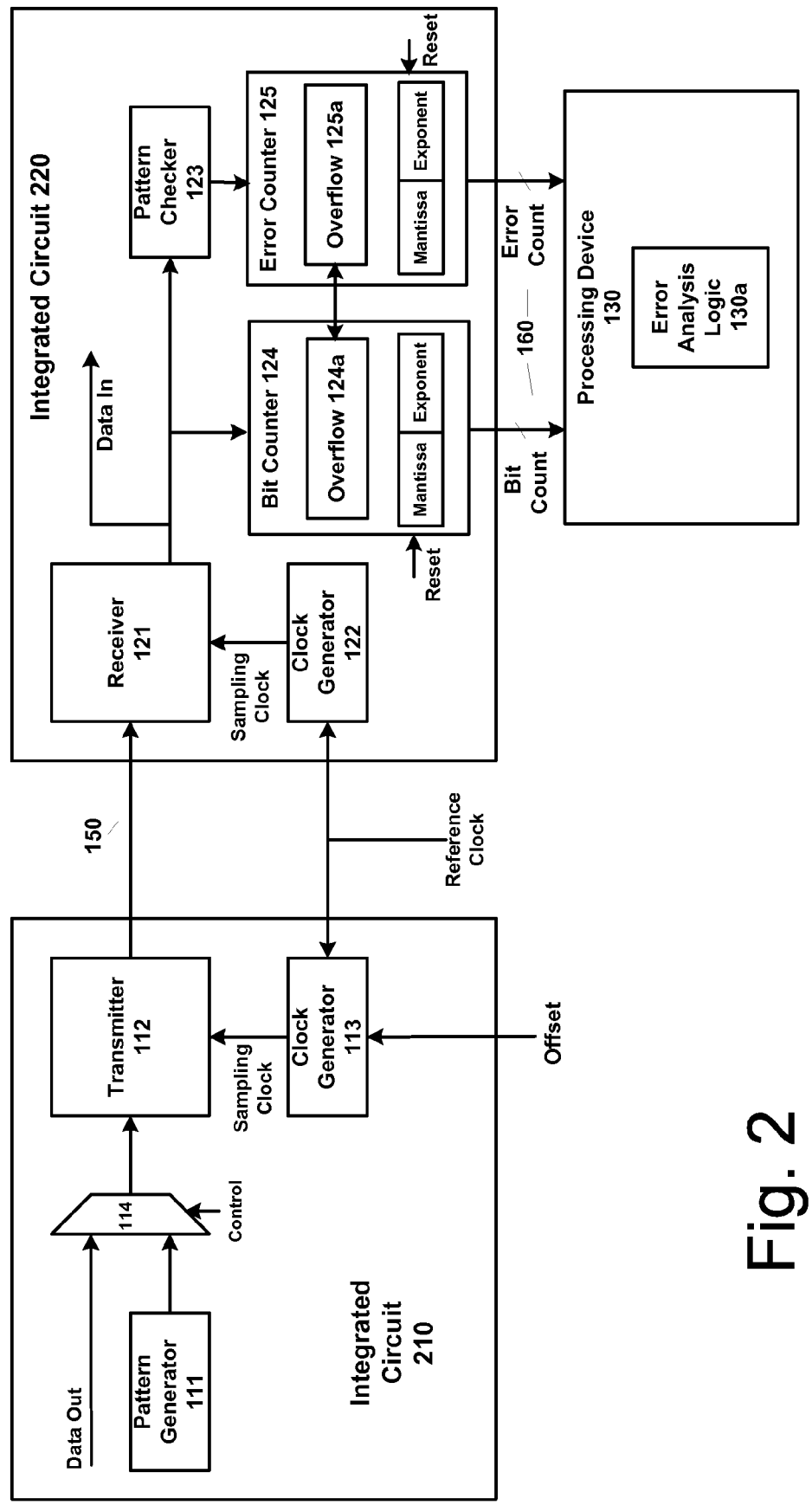
FIG. 2 illustrates an apparatus including offsetting a sampling clock signal in a transmitter according to an embodiment of the present invention.

FIG. 2 illustrates an apparatus 200 including offsetting a transmit clock signal in a transmitter according to an embodiment. FIG. 2 illustrates similar components shown in FIG. 1, where like referenced components operate similarly as described above. Apparatus 200 includes ICs 210 and 220, similar to ICs 110 and 120 of apparatus 100 shown in FIG. 1. Apparatus 200, unlike apparatus 100, generates a transmit clock signal to transmitter 112 from clock generator 113 responsive to an offset signal.

FIG. 3a illustrates an apparatus 300 including a memory array 324 according to an embodiment. FIG. 3a illustrates similar components shown in FIG. 1, where like referenced components operate similarly as described above. Unlike apparatus 100 shown in FIG. 1, apparatus 300 has a receiver and transmitter offset signal input to clock generator 113 to generate respective transmit and sampling clock signals for transmitter 112 and receiver 117, respectively. In an embodiment, receiver 117 samples data signals in response to a receiver offset signal input in a first mode of operation and transmitter 112 generates data signals in response to a transmitter offset signal input in a second mode of operation. In embodiments, receiver and transmitter offset signals are generated internally to IC 310 or externally by processing device 130. In an embodiment, IC 320 is a memory device including memory array 324 and IC 310 is a master device.

A memory device is a common class of integrated circuit devices that have a plurality of storage cells, collectively referred to as a memory array 324. A memory device stores data (which may be retrieved) associated with a particular address provided, for example, as part of a write or read command from a master device.

Examples of types of memory devices include discretely packaged synchronous type dynamic random access memory ("DRAM") ICs, for example, double data rate SDRAM (DDR) memory devices, Direct Rambus® memory devices ("DRDRAM"), or "XDR™" memory devices, although the memory devices might be any of a number of other types, including but not limited to static random access memory ("SRAM"), Ferroelectric RAM ("FRAM"), Magnetoresistive ("MRAM") or Magnetic RAM, Flash, or read only memory ("ROM") singly or in combination.

In an embodiment, IC 320 includes an input/output interface that includes request decode and array access logic (not shown) that, among other functions, decodes request and address information, and controls memory transfers between memory array 324 and routing path 350.

Receiver 121 is coupled to interconnect 150a, routing path 350 and clock generator 122. Transmitter 323 is coupled to clock generator 122, interconnect 150b and routing path 350 and transmits data signals from memory array 324 onto interconnect 150b.

Apparatus 300 operates similar to apparatus 100 described above. Apparatus 300 includes an IC 310 having pattern generator 111, multiplexer 114, transmitter 112 coupled to interconnect 150a and clock generator 113. In addition, IC 310 includes receiver 117 coupled to clock generator 113 and interconnect 150b for receiving data on interconnect 150b. Receiver 117 outputs data to pattern checker 123 coupled to error counter 125 having overflow protection 125a and bit counter 124 having overflow protection 124a. Processing device 130 including error analysis logic 130a is coupled to error counter 125 and bit counter 124 by interconnect 160.

Figure 3B:
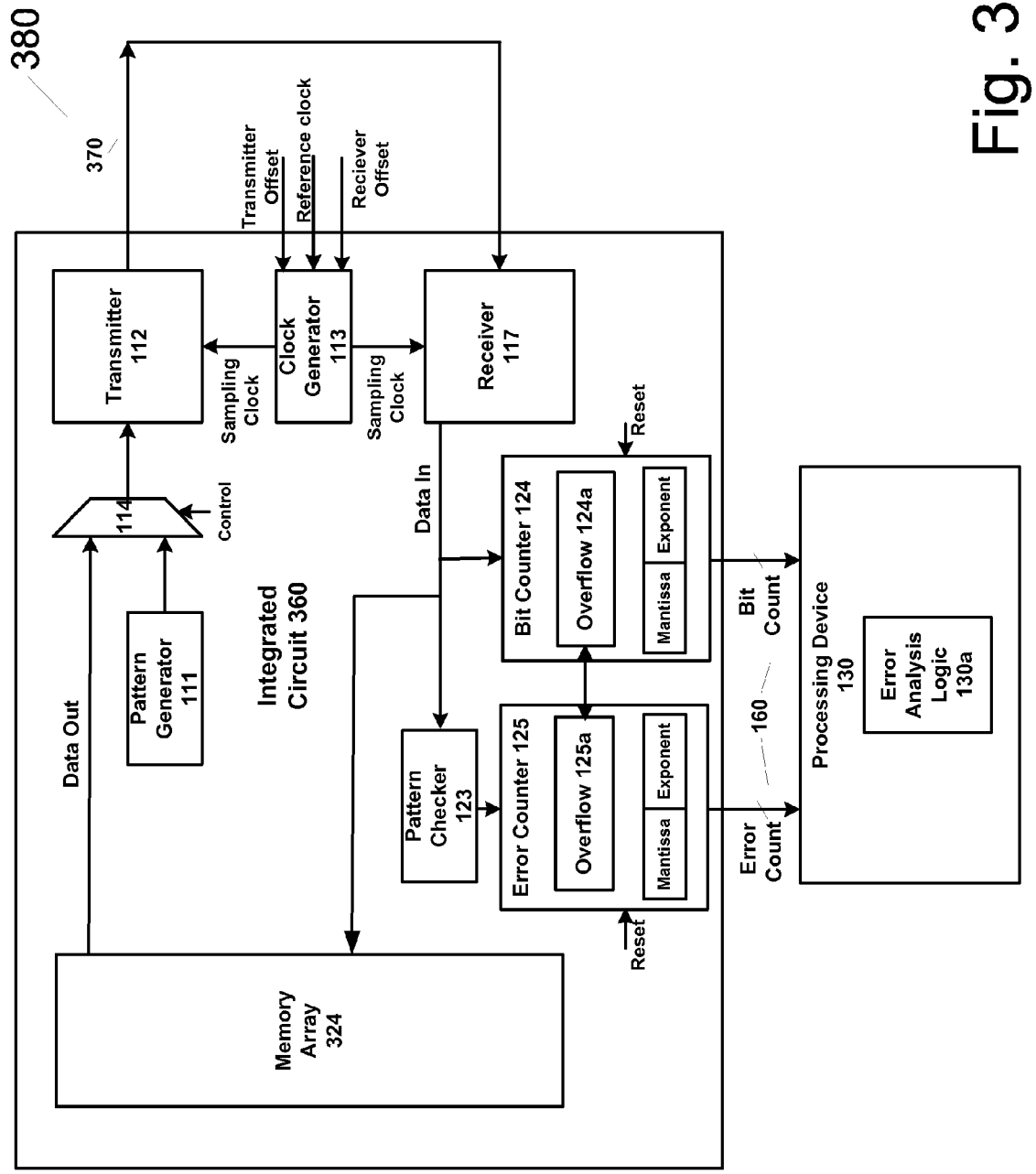
FIG. 3b illustrates an apparatus for self testing according to an embodiment of the present invention.

Apparatus 380 shown in FIG. 3b illustrates a self testing embodiment. Apparatus 380 includes an IC 360 having a memory array 324 that operates similarly to IC 310 shown in FIG. 3a. In an embodiment, IC 360 does not include a memory array 324. IC 360 is a memory device in an embodiment. IC 360 is self tested by using an interconnect 370 that is coupled to transmitter 112 and receiver 117. Interconnect 370 is an external set of wires for loop back testing in an embodiment. Interconnect 370 is an internal (to IC 360) interconnect in another embodiment.

RJ and DJ components are measured by generating a plurality of offset signals from the approximate center of LHS data edge fuzz band 404a and RHS data edge fuzz band 404b to produce points or a plurality of BER values on a jitter cumulative distribution function ("CDF"). A "CDF" is the cumulative probability of a transition occurring at a particular offset. A "CDF" can be thought of as the integration of a "PDF" described above and is bounded from zero to one in an embodiment. The points on the Gaussian portion of the jitter CDF curve (below a threshold, i.e. $10^{-5}$) are transformed using the inverse of the standard normal cumulative distribution function ("SNCDF") shown in Equation 1. An inverse of the SNCDF, ("NormSInv") transform is calculated by numerical methods in an embodiment of the present invention. The "NormSInv" function is built into many software programs such as MathCad 11 for Windows, provided by Mathsoft™ Engineering & Education, Inc. Massachusetts, USA and Wolfram Mathmatica for Windows, provided by Wolfram Research, Inc. Champaign, Ill., USA, with slightly different names. However, an Excel 2000, provided by Microsoft® Corporation of Redmond, Wash., USA, function call "NormSInv" is utilized for the transform calculations in an embodiment.

Equation 1: Standard normal (Gaussian) cumulative distribution function $$NORMSDIST(z) = \frac{1}{\sqrt{2\pi}} \int_z^\infty e^{\frac{-t^2}{2}} dt$$

Figure 8:
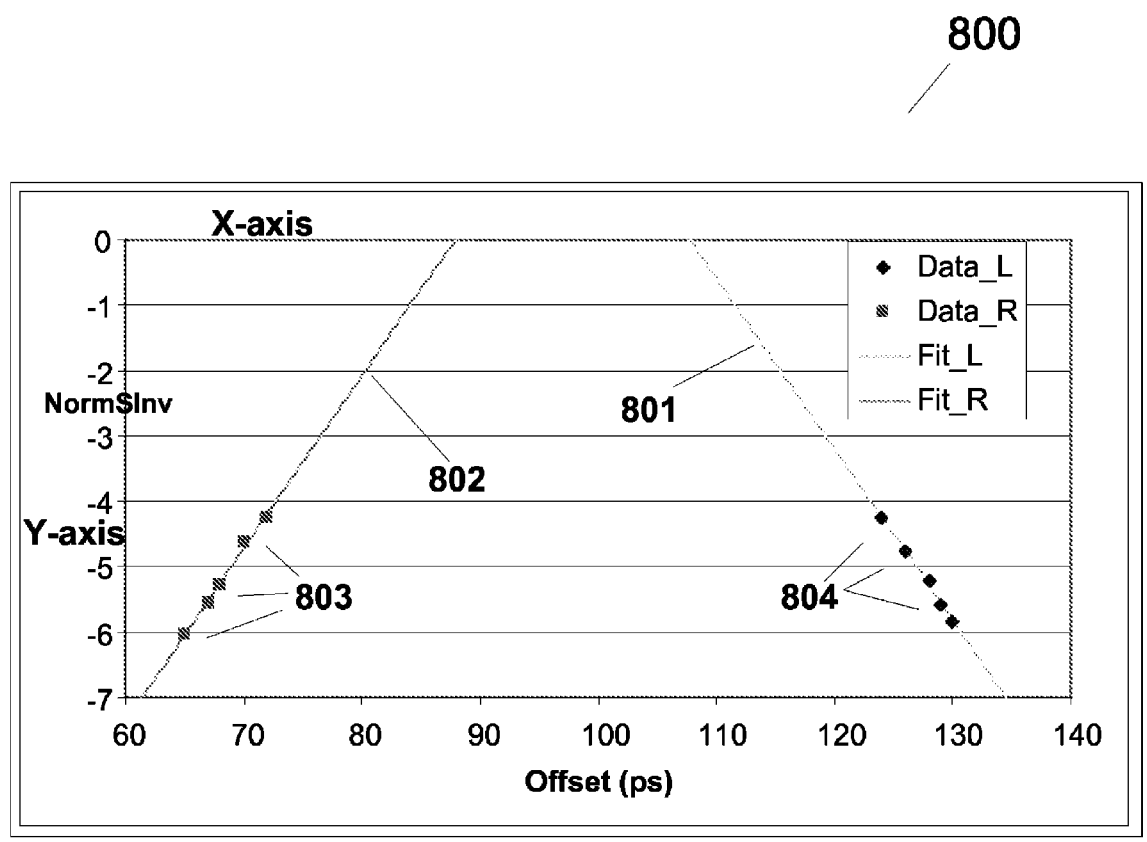
FIG. 8 illustrates a linear relationship between a plurality of transformed error values and a plurality of sampling clock signals according to an embodiment of the present invention.

The plurality of transformed BER values 803 and 804 or NormSInv values (Y-axis) are plotted versus the corresponding plurality of offsets (X-axis), as shown in chart 800 of FIG. 8, to produce a linear relationship. A linear fit is then applied to BER values 803 and 804 to provide lines 802 and 801, respectively. The x-intercept of lines 801 and 802 correspond to the mean of the Gaussian portion of the jitter CDF curve (DJ component), and the slope of lines 801 and 802 corresponds to the standard deviation of the Gaussian portion of the jitter CDF curve (RJ component). In particular a difference between the x-intercept of right line 801 and the x-intercept of left line 802 correspond to a DJ component.

In an embodiment, a minimum of three BER values are used to form two lines (two BER values for a first line and one BER value to locate the second line which has a slope equal to −1 time the slope of the first line) in obtaining DJ and RJ components. In an embodiment, a first plurality of BER values are used to form a first line and a second different plurality of BER values are used to form a second line.

The measured RJ and DJ components of the BER are then input into a Fibre Channel jitter model equation shown in equation 2 in order to calculate and predict BER. The Fibre Channel jitter model equation is a simplified model equation containing two equal height DJ impulses combined with Gaussian RJ.

Equation 2: Fibre Channel jitter model equation $$BER(t) = \frac{TD}{2} \cdot \left[2 - NORMSDIST\left(\frac{t - DJ/2}{RJ}\right) - NORMSDIST\left(\frac{t + DJ/2}{RJ}\right)\right]$$

TD is the transition density of the transferred data pattern where a value of 0.5 is used for a PRBS pattern in an embodiment. The function NORMSDIST is defined in Equation 1 above. Parameter t is an offset value from the approximate center of a LHS data edge fuzz band 404a and a RHS data edge fuzz band 404b as seen in FIG. 4.

Table 1 below illustrates starting (or observed/calculated) and transformed data stored in processing device 130 in order to obtain RJ and DJ jitter components in embodiments. Table 1 also illustrates chart data used to compare to numbers (or to lines 901 and 902 shown in plot 900 of FIG. 9) calculated by the Fibre Channel jitter model in Equation 2.

A first column of Table 1 represents a plurality of offset values in terms of a fraction of the unit interval ("UI") for a sampling clock signal corresponding to a respective plurality of calculated BERs. Both the left-hand side ("LHS") corresponding to negative offsets and right-hand side ("RHS") corresponding to positive offsets relative to an approximate center of a data eye is measured.

A second column represents corresponding offset values that have been converted into time (ps) or delay, relative to an approximate center of a data edge fuzz band.

A third column represents a plurality of BERs for corresponding offset values. In an embodiment, the plurality of BERs in the third column are calculated by dividing a total error count number output from error counter 125 by a total number of bits received output from bit counter 124.

A fourth column represents a corresponding plurality of transformed BER values by using a NormSInv transform described above.

A fifth column represents shifted time delays so the worst case BER value is centered at time 0 by using the average of the two x-intercepts shown in Table 2 that is described below.

A sixth column represents the logarithm of the observed BER (shown as data points 903 and 904 in FIG. 9) in order to compare it with lines 901 and 902 resulting from calculating the Fibre Channel jitter model equation with the measured RJ and DJ components. This mapping provides a means to extrapolate to low BER that would otherwise take an unreasonable amount of time to test in real time (i.e. one error every year). Additionally, the logarithm function can be used to generate a graphical representation of the BER variation with clock offset, commonly known as a "bathtub curve".

TABLE 1

Obtained data and calculation

| Starting Data | | | Transform | Chart Data | |
|---|---|---|---|---|---|
| LHS (UI) | Delay_L | BER_L | NormSInv | New Time | Log BER |
| −0.38 | 124 | 2.50E−06 | −4.26504 | 26 | −5.60206 |
| −0.37 | 126 | 2.30E−07 | −4.7705 | 28 | −6.63827 |
| −0.36 | 128 | 2.20E−08 | −5.22341 | 30 | −7.65758 |
| −0.355 | 129 | 3.00E−09 | −5.58083 | 31 | −8.52288 |
| −0.35 | 130 | 6.30E−10 | −5.84638 | 32 | −9.20066 |

| Starting Data | | | Transform | Chart Data | |
|---|---|---|---|---|---|
| RHS (UI) | Delay_R | BER_R | NormSInv | New Time | Log BER |
| 0.36 | 72 | 2.70E−06 | −4.24783 | −26 | −5.56867 |
| 0.35 | 70 | 4.50E−07 | −4.63346 | −28 | −6.34679 |
| 0.34 | 68 | 1.80E−08 | −5.26044 | −30 | −7.74473 |
| 0.335 | 67 | 3.30E−09 | −5.56423 | −31 | −8.48149 |
| 0.325 | 65 | 2.00E−10 | −6.03454 | −33 | −9.69897 |

The plurality of offset delays (column 2) and NormSInv transform values (column 4) from Table 1 are then fit to a straight line, as shown in FIG. 8, using a linear fit function that outputs the values shown in Table 2 below. In an embodiment, an Excel 2000 linear fit function is used.

TABLE 2

Linear fit parameters from NormSInv transform

| | Fit | | | |
|---|---|---|---|---|
| | m | b | Sigma | Mu |
| LHS | −0.26225 | 28.27298 | 3.813205 | 107.8107 |
| RHS | 0.263898 | −23.1988 | 3.789336 | 87.90787 |

A second column of Table 2 represents data that fits the slope of the BER data as represented by right line 801 and left line 802 seen in FIG. 8. In an embodiment, right line 801 corresponds to the transition between the LHS data edge fuzz band and the data eye center while left line 802 corresponds to the transition between the RHS data edge fuzz band and the data eye center.

A third column of Table 2 represents data that fit the x-intercept of the inputted data as represented by right line 801 and left line 802 seen in FIG. 8.

A fourth column of Table 2 represents Sigma, or standard deviation, of the Gaussian RJ that is the inverse of the magnitude of the slope of the respective fit lines 801 and 802.

A fifth column of Table 2 represents the Mu, or average, of the jitter distribution that is the x-intercept of the respective fit lines 801 and 802.

Sigma and Mu of the two lines 802 and 801 are then converted to RJ and DJ jitter components, as seen in Table 3, and used in a Fibre Channel jitter model equation. A RJ component of Table 3 is calculated by averaging the two standard deviation coefficients, Sigma, from Table 2. A DJ component of Table 3 is calculated by the difference between the two x-intercepts, Mu, from Table 2 (center of DJ impulses).

TABLE 3

RJ and DJ parameters for Fibre Channel jitter model equation

| RJ | DJ |
|---|---|
| 3.801270665 | 19.90280307 |

Figure 9:
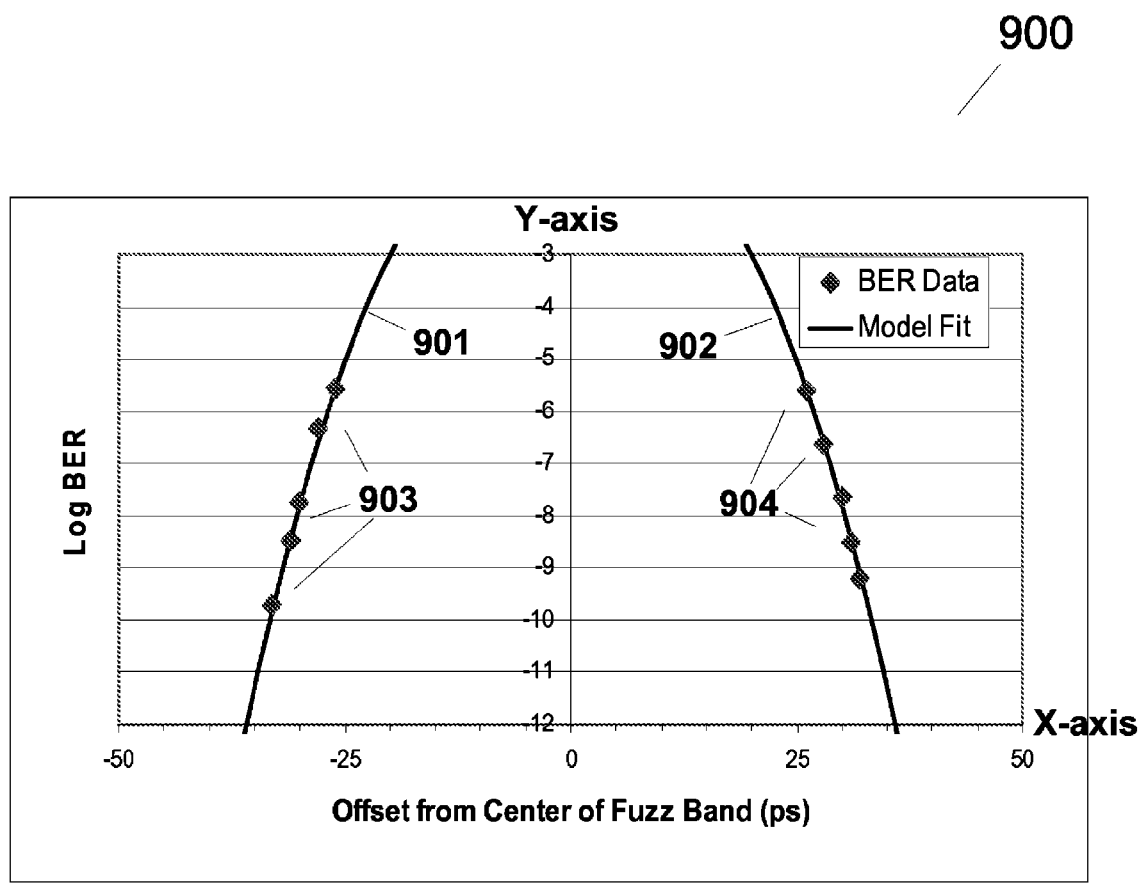
FIG. 9 illustrates a Fibre Channel jitter model fit according to an embodiment of the present invention.

FIG. 9 illustrates a BER Fibre Channel jitter model fit, lines 901 and lines 902, using RJ and DJ of Table 3 according to an embodiment. Lines 901 and 902, representing a Fibre Channel jitter model of equation 2 that provides an accurate prediction for BER as compared to measured data 903 and 904 from the last two columns of Table 1.

FIGS. 6, 7a-b and 11 illustrate methods 600, 700 and 1100 respectively, according to embodiments. In alternate embodiments, the steps or logic illustrated in FIGS. 6, 7a-b and 11 are carried out by hardware, software (i.e. executable machine readable instructions), a user or a combination thereof. In alternate embodiments, the steps illustrated in FIGS. 6, 7a-b and 11 are carried out by the components illustrated in FIGS. 1, 2, 3 and 10. As one of ordinary skill in the art would appreciate, other steps that are not shown may be included or shown steps may be excluded in various embodiments.

Method 600 begins at step 601 where a plurality of error rates corresponding to a plurality of sampling clock signals, in particular a plurality of respective offsets of a sampling clock, is obtained. In an embodiment, the plurality of error rates are obtained as described below, and in particular, using steps 701-713 shown in FIGS. 7a-b. In an embodiment, the plurality of error rates is a plurality of BERs.

The plurality of error rates are respectively transformed to obtain a plurality of transformed error rates in step 602. In an embodiment, a NormSInv transform function is used to transform respective error rates.

A linear relationship between the plurality of transformed error rates and the plurality of sampling clock signals is formed in step 603. In an embodiment, the linear relationship is formed by creating a linear fit with transformed error rate values and sampling clock signals (or sampling clock signal offset values) as illustrated by FIG. 8.

DJ and RJ values are obtained in steps 604 and 605, respectively. A DJ value is obtained by determining the difference between x-axis intercepts of two lines formed by a linear fit of the transformed error rate values and sampling clock offset values in an embodiment. An RJ value is obtained by determining the magnitudes of slopes of the lines formed by a linear fit of the transformed error rate values and sampling clock offset values in an embodiment.

Method 600 then ends.

In a further embodiment, DJ and RJ values are used in a BER Fibre Channel jitter model equation, as described above, to predict BER at any particular offset value.

Figure 6:
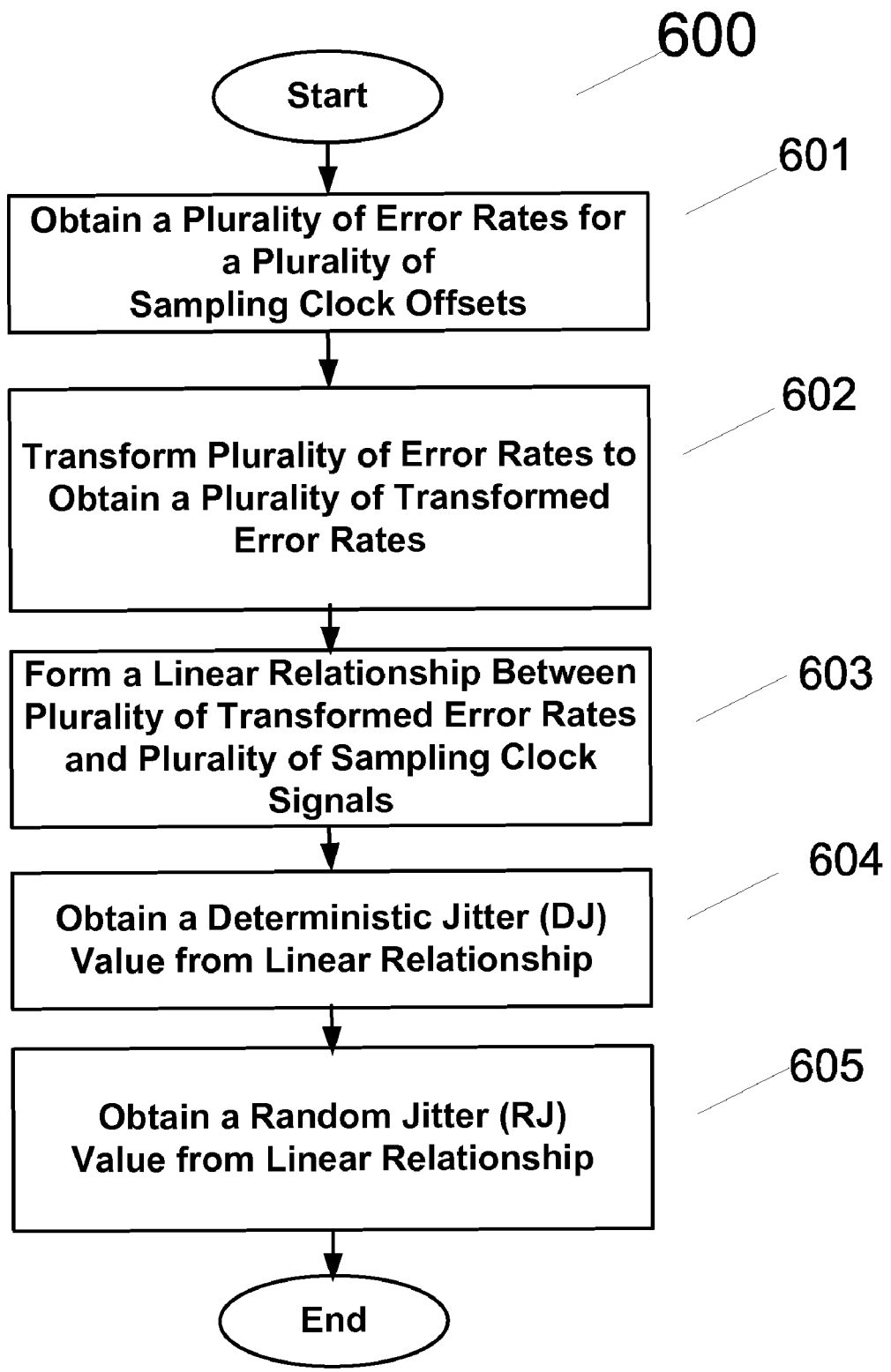
FIG. 6 illustrates a method according to an embodiment of the present invention.

In an embodiment, method 600 is performed by error analysis logic 130a in processing device 130. In an embodiment, method 600 is performed by software executed by a general purpose computer. In an embodiment, steps illustrated in FIG. 6 represent software components stored on an article of manufacture, such as a computer readable medium. For example, the software is stored in a magnetic hard disk, an optical disk, a floppy disk, compact disk read-only memory ("CD-ROM"), random access memory ("RAM"), read-only memory ("ROM"), or other readable or writeable data storage technologies, singly or in combination in embodiments. In embodiments, a software component is a software program, a software object, a software function, a software subroutine, a software method, a software instance, and a code fragment, singly or in combination.

Figure 7A:
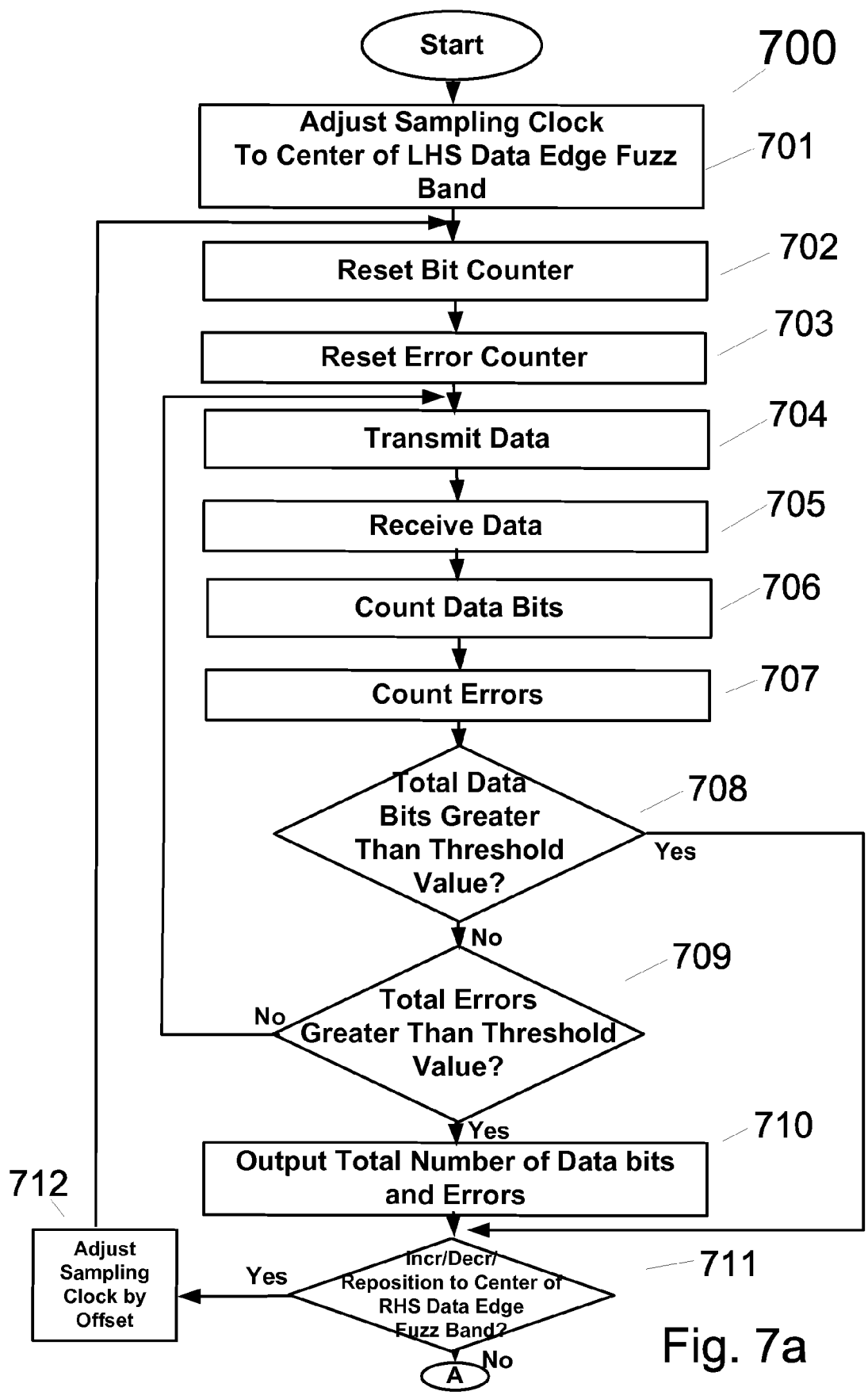
FIGS. 7a-b illustrate a method according to an embodiment of the present invention.
Figure 7B:
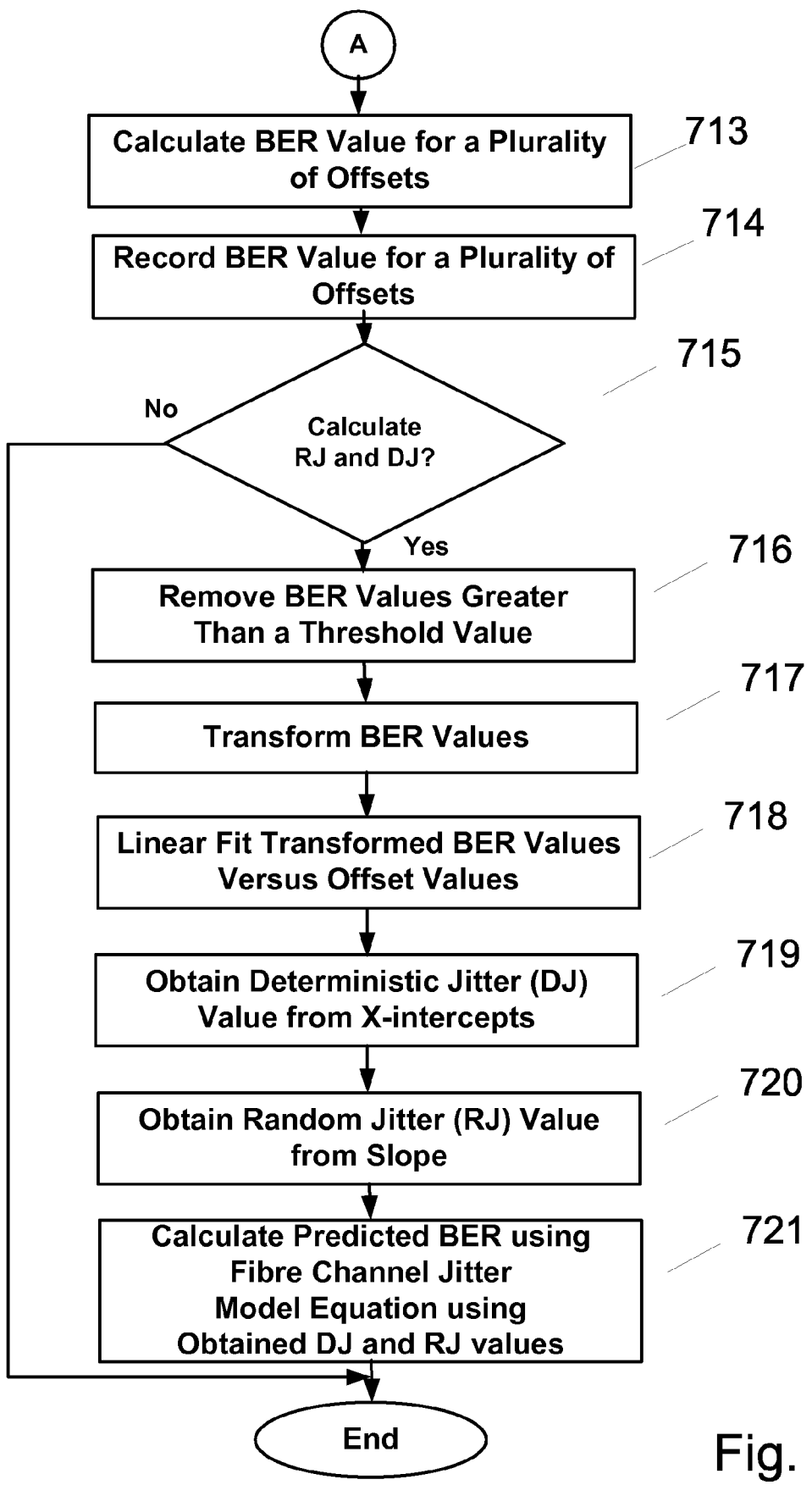

FIGS. 7a-b illustrate method 700 according to an embodiment. Method 700 begins at step 701 where a sampling clock signal is adjusted to an approximate center of a LHS data edge fuzz band. In an embodiment, sampling clock signal 405 is positioned at the approximate center of LHS data edge fuzz band 404a or at the left of data eye center 403 as illustrated in FIG. 4.

In an alternate embodiment, a sampling clock signal is first adjusted to an approximate center of a RHS data edge fuzz band, rather than a LHS data edge fuzz band, in step 701 and then repositioned to an approximate center of a LHS data edge fuzz band in step 711.

A bit counter and error counter is then reset to a predetermined value, such as zero, as illustrated by steps 702 and 703, respectively. In an embodiment, bit counter 124 and error counter 125, as illustrated in FIGS. 1, 2 and 3, are set to zero in embodiments.

Data is then transmitted and received as illustrated by steps 704 and 705, respectively. In embodiments, data is transmitted by transmitter 112, by way of interconnect 150, and received by receiver 121 as illustrated in FIGS. 1, 2 and 3.

Data bits and bit errors are counted as illustrated by steps 706 and 707, respectively. In an embodiment, bit counter 124 and error counter 125 count data bits and bit errors.

A determination is made whether the total number of data bits received is greater than a data bit threshold value as illustrated in step 708. If the data bit threshold value is met or exceeded, control transfers to step 711; otherwise control transfers to step 709. In an embodiment, if a threshold value is met or exceeded in step 708, a loop formed by steps 704-709 is broken or timeouts so there is no longer a waiting for a threshold value of errors.

A determination is made whether the total number of errors is greater than an error threshold value as illustrated in step 709. If the error threshold value is met or exceeded, control transfers to step 710; otherwise, control transfers back to step 704 and steps 704-708 are repeated. In an embodiment, data bit and error threshold values are stored in bit counter 124 and error counter 125, respectfully, in embodiments. In an embodiment, data bit and error threshold values are provided by processing device 130.

A total number of data bits received and corresponding total number of errors is then output as illustrated by step 710. In embodiments, a total number of data bits received and corresponding total number of errors is output on interconnect 160 to processing device 130 as shown in FIGS. 1, 2, 3 and 10.

A determination is made whether to increment, decrement or reposition a sampling clock signal to an approximate center of RHS data edge fuzz band 404b shown in FIG. 4. If a sampling clock signal will be adjusted, control transfers to step 712 that illustrates adjusting a sampling clock signal and steps 702-710 are then repeated; otherwise control transfers to step 713. In an embodiment, a sampling clock signal is incremented or decremented as illustrated by FIG. 4.

A BER value is then calculated for a corresponding sampling clock signal or offset value of such as illustrated by step 713. In an embodiment, a BER value is calculated by dividing the total number of errors output from error counter 125 by the total number of data bits received output from bit counter 124. In an embodiment, processing device 130 calculates the BER value.

A BER value corresponding to each sampling clock signal offset value is then recorded as illustrated by step 714 in an embodiment. In an embodiment, a BER value corresponding to a sampling clock signal offset value is stored in memory of processing device 130. In an embodiment, a plurality of BER values having corresponding sampling clock signal offset values is recorded.

A determination is made whether to calculate RJ and DJ as illustrated by step 715. In embodiments, a user or processing device 130 makes the determination.

The plurality of recorded BER values having respective offset values are truncated or removed based on a truncate threshold value as illustrated by step 716. In an embodiment, BER values greater than a threshold value of $10^{-5}$ are not used to calculate RJ and DJ values.

The remaining BER values are transformed as illustrated by step 717. In an embodiment, a NormSInv function as described above is used on each of the plurality of BER values that was not truncated.

A linear fit of transformed BER values and respective offset values is then created as illustrated by step 718. In an embodiment, a linear fit of transformed BER values and respective offset values is created as illustrated by lines 801 and 802 in FIG. 8.

A DJ value is then obtained in step 719. In an embodiment, a DJ value is obtained from the difference between the intercepts of the x-axis of the two lines formed in step 718.

A RJ value is then obtained in step 720. In an embodiment, a RJ value is obtained from a magnitude of a slope of a line formed in step 718.

A predicted BER is calculated using a Fibre Channel jitter model equation including the obtained DJ and RJ values in step 721. In an embodiment, processing device 130 calculates the predicted BER.

Figure 10:
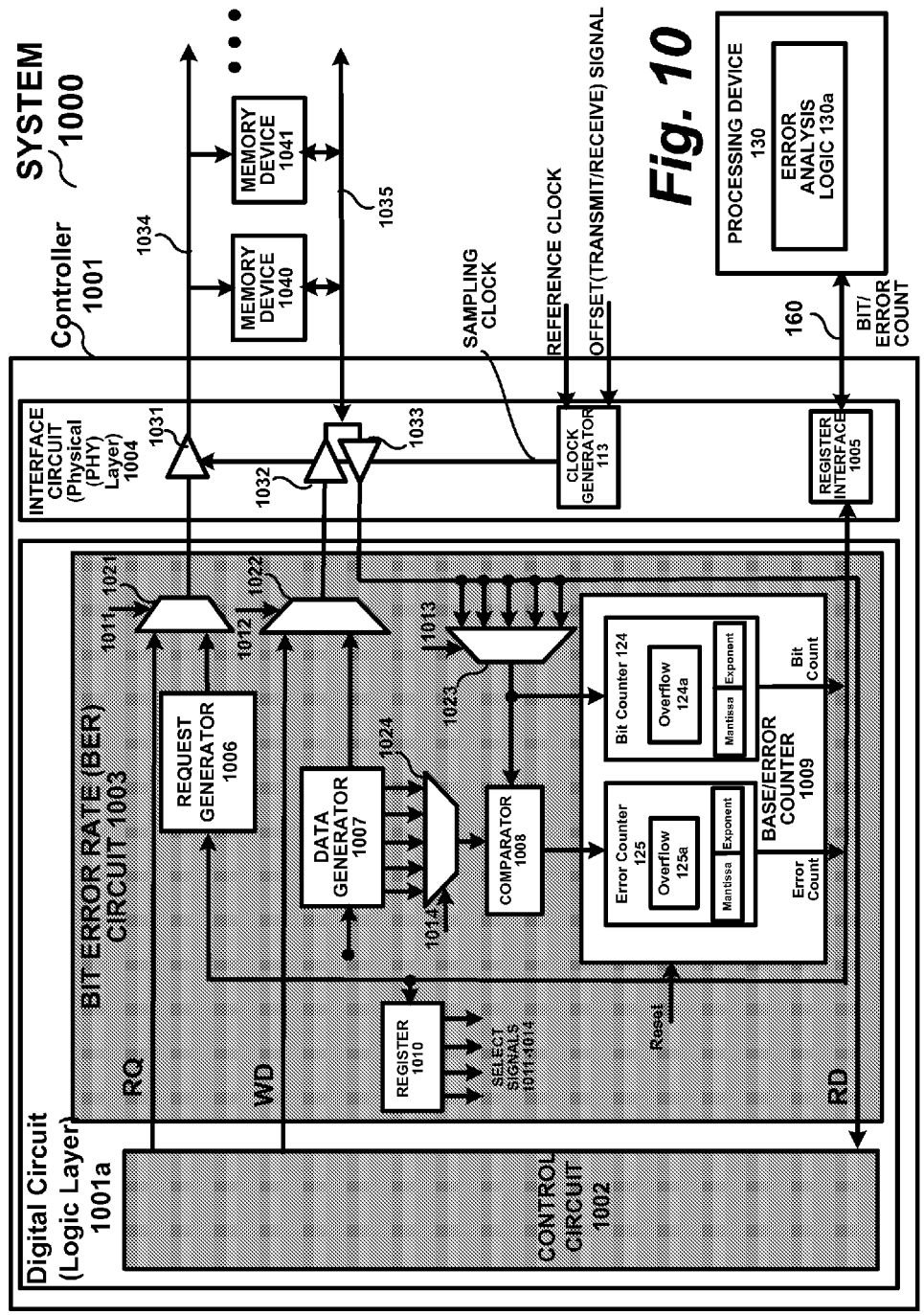
FIG. 10 illustrates a system including a controller having an integrated bit error rate circuit according to an embodiment of the present invention.

FIG. 10 illustrates a memory system 1000 including an integrated circuit memory controller 1001 having BER circuit 1003 that is included in a digital circuit 1001a (or digital domain/logic layer) as opposed to included in an interface circuit 1004 (or physical ("PHY") layer). A PHY layer/circuit in an integrated circuit may encode digital signals from a digital circuit into analog signals to be output from the integrated circuit. Similarly, a PHY layer/circuit decodes analog signals received by the integrated circuit into digital signals used by a digital circuit/domain of the integrated circuit.

Digital write and read data values are transferred between memory controller 1001 and memory devices 1040-41 using analog signals representing the digital write and read data values via interconnects 1034 and 1035. In an embodiment, control information, such as a memory request for accessing a memory device, is transferred from memory controller 1001 to memory devices 1040-41 on interconnect 1034. Write data values that may correspond to the memory request are transferred from memory controller 1001 to memory devices 1040-41 via interconnect 1035. Stored digital read data values likewise may be transferred using analog signals via interconnect 1035 from memory devices 1040-41 to memory controller 1001 in response to a memory request. In embodiments, interconnect 1034 is a unidirectional bus and interconnect 1035 is a bidirectional bus. In alternate embodiments, interconnects 1034 and 1035 represent other types of interconnects or topologies as described herein.

Bit and error count values are obtained by processing device 130 via interconnect 160 and register interface 1005 of interface 1004. In an embodiment, interconnect 160 is a serial bus. Processing device 130 may also store values in register 1010 via register interface 1005.

Memory controller 1001 includes control circuit 1002, BER circuit 1003 and interface circuit 1004. Control circuit 1002 includes logic for providing memory requests on interconnect RQ to request multiplexer 1021 and write data values on interconnect WD to write multiplexer 1022 in BER circuit 1003. Control circuit 1002 also receives read data values on interconnect RD from receive circuit 1033 in interface 1004.

BER circuit 1003 is integrated into memory controller 1001 (such as included into a single monolithic semiconductor substrate) in order to obtain error and bit count values, during a BER mode of operation. Request generator circuit 1006 and data generator circuit 1007 output memory requests to access one or more memory devices 1040-41 and corresponding write data values to be stored in one or more memory devices 1040-41 in response to control signals from processing device 130 via register interface 1005. Data generator circuit 1007 also outputs write data values to write multiplexer 1024 in order to determine when an error (and/or the number of errors) has occurred in the transfer and storing of the write data values. Comparator 1008 compares selected stored write data values output from write multiplexer 1024 (which corresponds to the received read data value) with received read data values from read multiplexer 1023. In an embodiment, data generator circuit 1007 includes a buffer or storage circuit to store one or more write data values previously transferred by way of write multiplexer 1022 that subsequently may be output (via write multiplexer 1024) and compared (via comparator 1008) to received read data values from read multiplexer 1023.

In response to a comparison of stored write data values and received read data values, comparator 1008 outputs a signal that represents the reception of one or more bits received to base/error counter 1009 that increments or adjusts a stored bit count value that represents the total number of received bits during a period of time. Comparator 1008 also outputs an error signal that represents an occurrence of one or more bit errors in response to a comparison of a selected write data value from write multiplexer 1024 and a received read data value from read multiplexer 1023. Base/error counter 1009 then increments or adjusts the stored error count value that represents the total number of bit error occurrences during the period of time in response to the error signal.

In an embodiment, base/error counter 1009 includes a bit counter 124 and error counter 125, as described herein, that outputs bit and error count values to processing device 130 via register interface 1005. In an embodiment, a reset signal for base/error counter 1009 is provided from register 1010 and/or register interface 1005. Error signals that are output from comparator 1008 are counted and stored in error counter 125. Similarly, bit values that are output from read multiplexer 1023 are counted and stored in bit counter 124.

In an embodiment, data generator circuit 1007 corresponds to pattern generator 111, shown in FIGS. 1, 2 and 3a-b, and may be initialized by a control signal from processing device 130. In an embodiment, one or more memory devices 1040-41 correspond to IC 320 or 360 shown in FIGS. 3a-b. In an embodiment, base/error counter 1009 corresponds to bit and error counters 124 and 125 shown in FIGS. 1, 2 and 3a-b. Bit and error count values may then be output or accessed by processing device 130 via register interface 1005 and interconnect 160 in order to obtain predicted BER values.

In an embodiment, memory controller 1001 may operate in first and second modes of operation. In a first mode of operation, such as a typical mode of operation, memory controller 1001 transfers write and read data values to and from memory devices 1040-41. Control or select signals 1011-1014 are output from a storage circuit, such as register 1010, to multiplexers 1021-1024 so that a memory request is provided from control circuit 1002 on interconnect RQ to interface 1004 (via request multiplexer 1021 in response to select signal 1011)

along with corresponding write data values on interconnect WD from control circuit 1002 on interconnect WD to interface 1004 (via write multiplexer 1022 in response to select signal 1012). Similarly, during the first mode of operation, read data from interface 1004 is provided to control circuit 1002 on interconnect RD. In an embodiment, offset signals are not provided to clock generator 113 during a first mode of operation. Likewise, request and data generator circuits 1006 and 1007 may not output memory requests and data in a first mode of operation. In an embodiment, processing device 130, via register interface 1005 stores a multi-bit value in register 1010 so that the appropriate select signals are output to the particular multiplexers during different modes of operation. Similarly, processing device 130 may store a value in register 1010 indicating a particular mode of operation that causes control circuit 1002 (after reading register 1010) to generate select signals 1011-1014 in an embodiment.

In a second mode of operation, such as a test, initiate or maintenance mode of operation (BER mode), memory requests are output from request generator 1006 (via request multiplexer 1021 in response to select signal 1011) in response to control signals from processing device 130 via register interface 1005. A control signal from processing device 130 to request generator 1006 may identify a particular memory request or control information for accessing a particular memory device at a particular address during the second mode of operation. Similarly, a control signal from processing device 130 to data generator 1007 may identify a particular write data to be stored at a particular address during the second mode of operation. As in the first mode of operation, a multi-bit value may be stored in register 1010 by processing device 130 (via register interface 1005) to output select signals 1011-1014. Write multiplexer 1024 and read multiplexer 1023 output stored write data and received read data to compare circuit 1008 in response to select signals 1014 and 1013. During the second mode of operation, bit and error count values may be accessed from base/error counter 1009 by processing device 130 so that predicted BER values may be obtained as described herein.

In an embodiment, the BER circuit includes buffer circuits to buffer memory requests and write data from control circuit 1002 as well as read data from interface 1004. Similarly, data generator circuit 1007 may include a buffer or queue circuit to store a plurality of pending and/or subsequently transmitted write data values.

Memory controller 1001 also includes interface 1004 that includes one or more receive and transmit circuits. In embodiments, receive circuit 1033 corresponds to receiver 121 while transmit circuits 1031 and 1032 correspond to transmitter 112 shown in FIGS. 1, 2 and 3*a-b*, singly or in combination. In embodiments, interface 1004 includes a plurality of (shared and/or dedicated) contacts or pins that have corresponding transmit and/or receive circuits. Transmit and receive circuits may be coupled to form a transceiver. In embodiments, multiple transmit and receive circuits may be included in interface 1004 as well as a single transmit and receive circuit. Request multiplexer 1021 outputs a memory request to one or more transmitter circuits 1031 that in turn output a corresponding signal on interconnect 1034 via a contact (such as a pin). Similarly, write multiplexer 1022 outputs a write data value to transmit circuit 1032 that in turn outputs a corresponding signal on interconnect 1035 via a contact. Receive circuit 1033 inputs a read data value from interconnect 1035 (via a contact) to read multiplexer 1023 and control circuit 1002 via interconnect RD. Transmit and receive circuits in interface 1004 input and output information in response to one or more xmit/sampling clock signals from clock generator circuit 113 as described herein. An xmit/sampling clock signal may be output in response to a reference signal and/or offset signals. In embodiments, reference and offset signals may be provided to interface 1004 from processing device 130, internal to memory controller 1001 and/or external to memory controller 1001. In an embodiment, clock generator circuit 113 includes a phase lock loop circuit or a delay lock loop circuit. In an embodiment, an xmit/sampling clock signal has a temporal relationship with transferred or received control information, read data values and/or write data values.

In an embodiment, transmit circuits in interface circuit 1004 may include output driver circuits to output respective signals onto signal paths and may be pull-up, pull-down and/or push-pull type output driver circuits.

Figure 11:
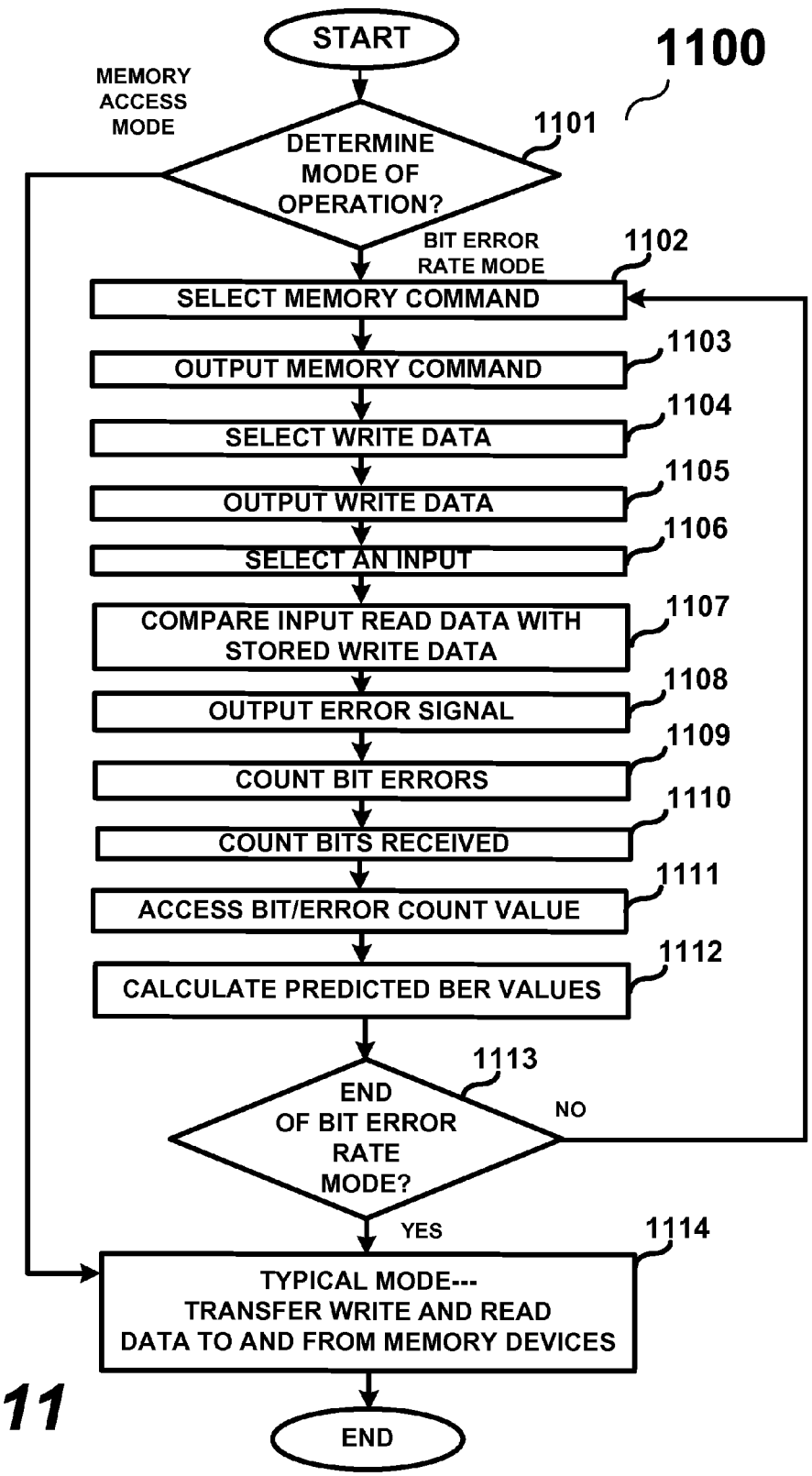
FIG. 11 illustrates a method according to an embodiment of the present invention.

FIG. 11 illustrates a method 1100 of operating an integrated circuit memory controller. In an embodiment, method 1100 illustrates operating memory controller 1001 shown in FIG. 10. Method 1100 begins by making a determination as to a mode of operation of a memory controller, as illustrated by step 1101. In embodiments, a determination is made at memory controller power-up, initialization, calibration or during manufacturing/production testing, singly or in combination. A mode value stored in a register may be read to determine whether a BER mode or typical mode of operation is entered. For example, a multi-bit value may be stored in register 1010 where one or more bit values may indicate a mode of operation. In an embodiment, processing device 130 may load the multi-bit mode value into register 1010 by way of interface 1005. When a BER mode of operation is entered, control transfers to step 1102. When a typical memory access mode of operation is entered, control transfers to step 1114 where write data is provided to the integrated circuit memory devices from the memory controller and stored read data from the integrated circuit memory devices is received by the memory controller.

In a BER mode of operation, a memory command or memory request (transaction) is selected and output from a memory controller interface as illustrated by steps 1102 and 1103. In an embodiment, particular memory commands are output in response to a processing device selection. For example, processing device 130 provides a select signal to memory request generator 1006 via register interface 1005 to select a particular memory command to be output.

Similarly, a write data value associated with a selected memory command is selected and output from a memory controller interface as illustrated by steps 1104 and 1105. In an embodiment, a particular write data value is output in response to a processing device selection. For example, processing device 130 provides a select signal to write data generator 1007 via register interface 1005 to select a particular write data value to be output that is associated with the selected memory command.

An input is selected to receive read data as illustrated by step 1106. For example, a selected output of a multiplexer coupled to a plurality of inputs or pins in the memory controller interface are selected.

Read data from the selected input is then compared to stored write data in order to determine when a bit error occurred as illustrated by step 1107. When the read data does not match or equal the stored write data an error signal is output and counted as illustrated by steps 1108 and 1109. In an embodiment, the number of received bits or bit count may likewise be counted/incremented as illustrated by step 1110.

Bit and error count values may be accessed as illustrated by steps 1111. In an embodiment, a processing device accesses the bit and error count values from respective counters and calculates a predicted BER value as described herein and illustrated by step 1112.

A determination is made whether a BER mode of operation ends as illustrated by step 1113. When the BER mode of operation ends, control transfers to step 1114 where typical memory access operations occur and may end at power-down. Otherwise, a BER mode of operation continues by transferring control to step 1102 where one or more steps 1102-1113 may be repeated.

In embodiments, controller 1001 is a master device, which may be an integrated circuit device that contains other interfaces or functionality, for example, a Northbridge chip of a chip set. Controller 1001 may be integrated on a microprocessor or a graphics processor unit ("GPU") or visual processor unit ("VPU"). Controller 1001 may be implemented as a field programmable gate array ("FPGA"). Controller 1001 may be included in various systems or subsystems such as servers (e.g., a blade server), personal computers, graphics cards, set-top boxes, cable modems, cell phones, game consoles, digital television sets (for example, high definition television ("HDTV")), fax machines, cable modems, digital versatile disc ("DVD") players or network routers.

Signals described herein may be transmitted or received between and within controllers/memory modules/devices/circuits by electrical or light conductors and generated using any number of signaling techniques including without limitation, modulating the voltage or current level of an electrical signal. The signals may represent any type of control and timing information (e.g., commands, address values, clock signals, and configuration information) as well as data. In an embodiment, a request packet is provided from a controller 1001 to one or more memory devices 1040-41 on one or more memory modules and between memory modules. In an embodiment, control, address and or data information is included in a request packet that represents one or more signals asserted at particular bit windows on particular signal lines.

It should be noted that the various circuits disclosed herein may be described using computer aided design tools and expressed (or represented) as data and/or instructions embodied in various computer-readable media, in terms of their behavior, register transfer, logic component, transistor, layout geometries, and/or other characteristics. Formats of files and other objects in which such circuit expressions may be implemented include, but are not limited to: formats supporting behavioral languages such as C, Verilog, and HLDL; formats supporting register level description languages like RTL; formats supporting geometry description languages such as GDSII, GDSIII, GDSIV, CIF, MEBES; and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described circuits may be processed by a processing entity (e.g., one or more processors) within the computer system in conjunction with execution of one or more other computer programs including, without limitation, netlist generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A controller comprising:
   a physical interface to provide a digital read data value from a signal that represents the read data value, the physical interface including a receive circuit to receive the signal that represents the read data value in response to a clock signal; and
   a digital circuit including:
      a read multiplexer to selectively input the digital read data value in response to a read control signal;
      a comparator to output an error signal that represents a bit error in response to a comparison of the digital read data value and a stored write data value; and
      a counter to adjust an error count value that represents a number of bit errors in response to the error signal.

2. The controller of claim 1 wherein the digital circuit includes:
   a request generator circuit to output a request for a memory transaction;
   a request multiplexer to selectively output the request for the memory transaction to the interface in response to a request control signal;
   a data generator circuit to output a digital write data value corresponding to the request for the memory transaction to the interface; and
   a first write multiplexer to selectively output the digital write data value from the data generator circuit to the interface in response to a write control signal.

3. The controller of claim 2 wherein the digital circuit includes:
   a control circuit to output another memory request to the request multiplexer, the control circuit to output another digital write data to the first write multiplexer,
   wherein the request multiplexer outputs the another memory request in response to the request control signal and the first write multiplexer outputs the another digital write data in response to the write control signal.

4. The controller of claim 2 wherein the digital circuit includes:
   a second write multiplexer to selectively output the stored write data value from the data generator circuit to the comparator in response to another write control signal.

5. The controller of claim 4 wherein the interface includes a register interface to obtain the error count value, access the request generator circuit and access the data generator circuit.

6. The controller of claim 4 wherein the digital circuit includes:
a storage circuit to output the read control signal, request control signal, write control signal and another write control signal in response to a stored value.

7. The controller of claim 1 wherein the controller is included in a memory system having a plurality of integrated circuit memory devices, wherein the interface receives the signal that represents the read data value, the read data is stored in one or more of the plurality of integrated circuit memory devices.

8. An integrated circuit memory controller comprising:
an interface;
a control circuit; and
a bit error rate circuit, wherein the integrated circuit memory controller operates in a first and second mode of operation,
during the first mode of operation, the control circuit outputs first control information and a first write data value to the interface and the control circuit receives a first read data value from the interface, and
during the second mode of operation, the bit error rate circuit outputs second control information and a second write data value to the interface, and the bit error rate circuit receives a second read data value from the interface, wherein the bit error circuit compares the second write data value to the second read data value to determine an occurrence of a bit error.

9. The integrated circuit memory controller of claim 8 wherein the bit error rate circuit includes:
a multiplexer to selectively input the second read data value in response to a signal indicating the second mode of operation;
a comparator to output an error signal indicating the occurrence of the bit error in response to a comparison of the second read data value and second write data value; and
a counter to adjust a stored error count value that represents a number of bit errors during a period of time in response to the error signal.

10. The integrated circuit memory controller of claim 9 wherein the interface includes a register interface to access the error count value by a processing device.

11. The integrated circuit memory controller of claim 9 wherein the interface includes a plurality of receive circuits coupled to a plurality of contacts, wherein the multiplexer is coupled to the plurality of receive circuits.

12. The integrated circuit memory controller of claim 9 wherein the bit error rate circuit includes a storage circuit to output the signal indicating the second mode of operation in response to a mode value stored in the storage circuit, wherein a processing device stores the mode value by way of the interface.

13. A method of operating a memory controller, the method comprising:
determining when the memory controller is in a bit error rate mode of operation;
selecting a memory command from a plurality of memory commands;
outputting the memory command to an interface;
outputting a write data value corresponding to the memory command to the interface;
selecting an input to receive a read data value corresponding to the write data value;
comparing the read data value to the write data value; and
outputting a bit error signal in response to the comparing.

14. The method of claim 13 further comprising:
adjusting a stored bit error count value that represents a number of bit errors in response to the bit error signal;
outputting the bit error count value to the interface.

15. The method of claim 14 further comprising:
calculating a predicted bit error rate value in response to the bit error count value.

16. The method of claim 13 wherein the determining includes receiving a signal indicating operating in the bit error rate mode of operation from a processing device.

17. The method of claim 13 wherein the selecting an input includes generating a control input signal to a read multiplexer to select an output, the read multiplexer coupled to a plurality of inputs in the interface.

18. The method of claim 17 wherein the selecting a memory command includes generating a control output signal to a write multiplexer to select an output, the write multiplexer coupled to the interface.

19. An integrated circuit memory controller comprising:
an interface to transfer write data and read data;
means for determining a number of bit errors in response to a control signal that indicates a mode of operation;
means for selectively receiving read data from the interface; and
means for comparing stored write data and received read data from an integrated circuit memory device and to output an error count value that represents the number of bit errors.

* * * * *